(12) United States Patent
Fukui et al.

(10) Patent No.: US 6,518,108 B2
(45) Date of Patent: Feb. 11, 2003

(54) ELECTRONIC DEVICE AND A METHOD FOR MAKING THE SAME

(75) Inventors: Hirofumi Fukui, Miyagi-ken (JP); Chisato Iwasaki, Miyagi-ken (JP)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/899,869

(22) Filed: Jul. 5, 2001

(65) Prior Publication Data

US 2002/0000616 A1 Jan. 3, 2002

Related U.S. Application Data

(63) Continuation of application No. 08/595,574, filed on Feb. 1, 1996.

(30) Foreign Application Priority Data

Feb. 8, 1995 (JP) .............................................. 7-020468

(51) Int. Cl.[7] .............................................. H01L 21/00
(52) U.S. Cl. ........................ 438/161; 438/149; 438/160; 257/359
(58) Field of Search .................. 257/359; 438/160–161, 438/149

(56) References Cited

U.S. PATENT DOCUMENTS

| 4,788,157 | A | * | 11/1988 | Nakamura | 437/46 |
|---|---|---|---|---|---|
| 5,286,659 | A | | 2/1994 | Mitani et al. | 437/21 |
| 5,306,653 | A | * | 4/1994 | Hur | 437/40 |
| 5,680,183 | A | * | 10/1997 | Sasuga et al. | 349/58 |
| 5,897,188 | A | * | 4/1999 | Sasuga et al. | 349/150 |

FOREIGN PATENT DOCUMENTS

| JP | 59-124165 | * | 7/1984 | 257/57 |
|---|---|---|---|---|
| JP | 59-124165 | | 7/1987 | |
| JP | 5-283428 | | 10/1993 | 257/57 |

* cited by examiner

*Primary Examiner*—Phat X. Cao
*Assistant Examiner*—Thao X. Le
(74) *Attorney, Agent, or Firm*—Brinks Hofer Gilson & Lione

(57) ABSTRACT

An electronic device which comprises a gate electrode on one surface of a substrate and a gate insulating film covering the substrate and the gate electrode therewith is described. The device further comprises a semiconductor active layer formed above the gate electrode and having a width smaller than the gate electrode, and a source electrode and a drain electrode formed on the semiconductor active layer through an ohmic contact layer wherein the space between the source electrode and the drain electrode kept away from each other is wider than the space between the spaced ohmic contact layers, and the substrate is irradiated with light from the other surface on which the gate electrode is not formed. A method for making the device is also described.

3 Claims, 2 Drawing Sheets

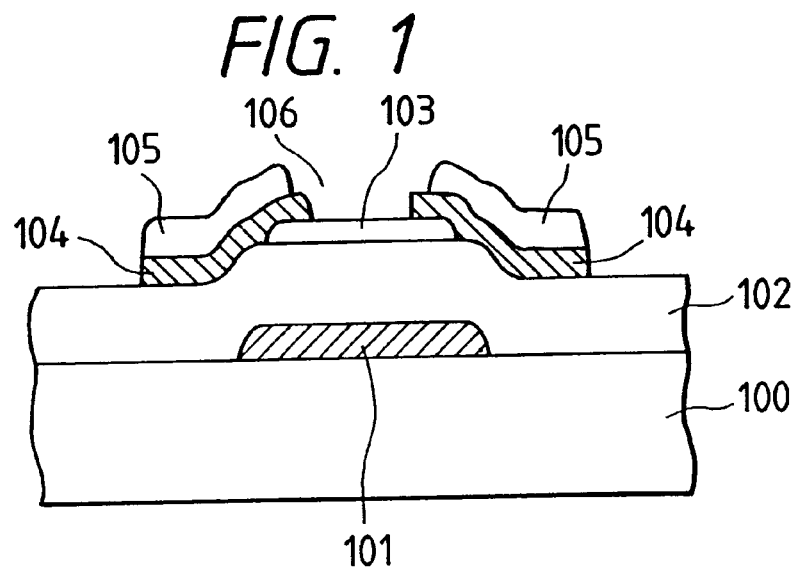
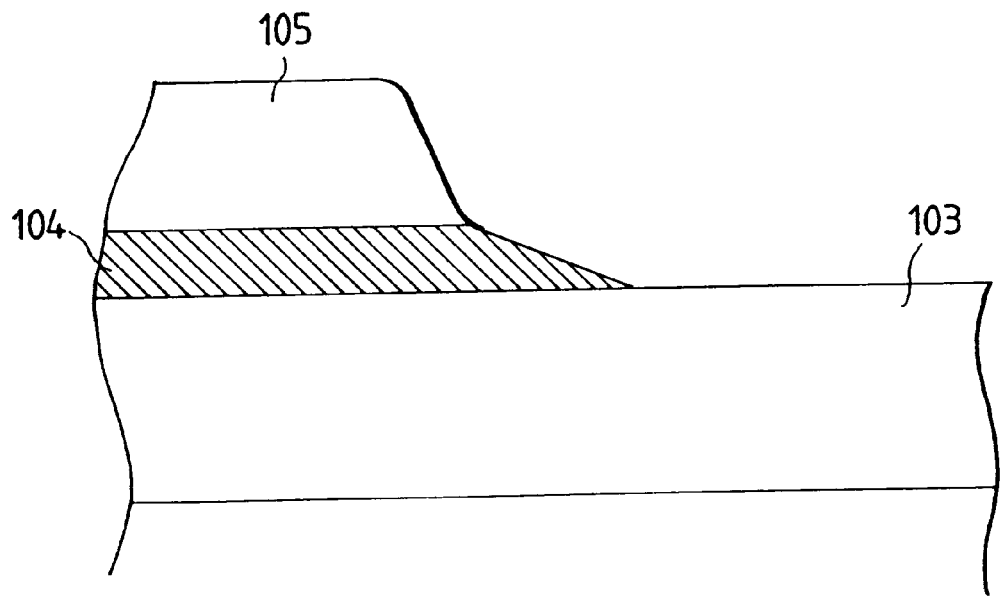

ELECTRONIC DEVICE AND A METHOD FOR MAKING THE SAME

"This application is a continuation of application Ser. No. 08/595,574, filed Feb. 1, 1996, (pending), which is hereby incorporated by reference herein."

BACKGROUND OF THE INVENTION

This invention relates to an electronic device and a method for making the same. More particularly, the invention relates to an electronic device wherein a semiconductor active layer and a gate electrode are in limited relative position from each other and wherein a space between conductor layers and a space between ohmic contact layers are, respectively, controlled, and also to a method for making such a device as mentioned above.

Existing electronic devices which are formed as a switching device relative to an active matrix substrate used in liquid crystal display devices and shutter arrays include reverse staggered thin film transistors (TFT) shown, for example, in FIGS. 3 to 5.

(1) With the structure of FIG. 3, both a semiconductor active layer 303 consisting of a-Si (i) and an ohmic contact layer 304 consisting of a-Si (n+) have a width greater than a gate electrode 301. When light is irradiated from the back side of a substrate, the light is permitted to invariably pass to part of the semiconductor active layer 303. Eventually, the OFF current ($I_{OFF}$) rises with a lowering of S/N sensitivity.

(2) With the structure shown in FIG. 4, there is no problem involved in (1) above. However, a semiconductor active layer 403 consisting of a-Si (i) directly contacts, at the side face thereof, with a conductor layer 405 made, for example, of Al/Cr, thus presenting the problem that $I_{OFF}$ undesirably rises.

(3) With the structure of FIG. 5, the problems of (1) and (2) above can be solved. Nevertheless, an additional step is essential for forming a channel protective layer (i.e. an etch stopper layer) consisting of silicon nitride between a semiconductor active layer 503 and an ohmic contact layer 504.

As will be apparent from the above, in order to suppress the rise of $I_{OFF}$ in case where light is irradiated from the back side of the substrate, the prior art (3) can provide the best structure.

In this connection, the prior art techniques (1) and (2) have the following common problem.

(a) In order to form a source electrode and a drain electrode and also to remove the ohmic contact layer from the semiconductor active layer, a resist mask used to form the source and drain electrodes is employed to process the source and drain electrodes therewith. Thereafter, using this mask, the ohmic contact layer on the semiconductor active layer is processed. Accordingly, where the conductor layer and the ohmic contact layer are successively etched, the ohmic contact layer below the end of the conductor layer is likely to be side etched, thereby causing a gap to be formed. This leaves the residue of an etchant in the gap, thereby degrading TFT characteristics.

On the other hand, the prior art technique (3) also has the following problems.

(b) The semiconductor active layer is liable to suffer damages owing to the ion implantation used to form the ohmic contact layer.

(c) The production costs increase because of the additional step of forming the channel protective layer.

(d) Since the channel protective layer is additionally formed, the resultant device is formed as being more stepped, so that electric concentration or short-circuiting is apt to occur at the stepped portion or portions.

SUMMARY OF THE INVENTION

It is therefore an object of the invention to provide an electronic device which can suppress the rise of $I_{OFF}$ when light is irradiated from the back side of a substrate without the formation of any channel protective layer.

It is another object of the invention to provide a method for making such an electronic device at reduced production costs.

The above objects can be achieved, according to one embodiment of the invention, by an electronic device of the type which comprises a substrate, a gate electrode formed on one surface of the substrate, and a gate insulating film covering the substrate and the gate electrode therewith, characterized by comprising a semiconductor active layer formed above the gate electrode and having a width smaller than the gate electrode, and a source electrode and a drain electrode formed on the semiconductor active layer through an ohmic contact layer, the source electrode and the drain electrode being, respectively, made of a conductor layer and being in a spaced relation from each other, wherein the ohmic contact layers are, respectively, formed between the semiconductor active layer, and the source electrode and the drain electrode, the space between the source electrode and the drain electrode kept away from each other is wider than the space between the spaced ohmic contact layers, and the substrate is irradiated with light from the other surface on which the gate electrode is not formed.

Preferably, the semiconductor active layer of the electronic device of the invention is made of amorphous silicon, and the ohmic contact layer is made of the semiconductor active layer to which an impurity is added. The conductor layer should preferably be made of a metal such as Al, Ti, Mo or Cu, an alloy thereof, or a compound of the metal.

According to another embodiment of the invention, there is also provided a method for making an electronic device which comprises a substrate, a gate electrode formed on one surface of the substrate, and a gate insulating film covering the substrate and the gate electrode therewith, characterized in that where a semiconductor active layer having a width smaller than the gate electrode is formed just above the gate electrode, the gate insulating film and the semiconductor active layer are continuously formed by a CVD method in such a way that the semiconductor active layer is formed narrower in width than the gate electrode, and a source electrode and a drain electrode both made of a conductor layer are formed through an ohmic contact layer on the semiconductor active layer, that where the ohmic contact layer is formed between the semiconductor active layer and the source electrode and also between the semiconductor active layer and the drain layer, respectively, the ohmic contact layers, the source electrode and the drain layer are continuously formed by a sputtering method, that where a space between the source electrode and the drain electrode spaced from each other is wider than a space between the ohmic contact layers kept away from each other, the source electrode, the drain electrode and the ohmic contact layers are all continuously removed with an etchant, and that a light irradiating means is provided at the other surface of the substrate, where the gate electrode has not been formed, so that light is permitted to pass vertically to the substrate.

Preferably, according to the method of the invention, the etchant has an etching rate for the source electrode and also for the drain electrode higher than an etching rate for the ohmic contact layers.

In the first embodiment of the invention as claimed in claim 1, since the semiconductor active layer whose width is smaller than the gate electrode is formed just above the gate electrode, the rise of $I_{OFF}$ can be suppressed on irradiation of light from the other side of the substrate. Moreover, the source electrode and the drain electrode which are, respectively, made of the conductor layer and are formed on the semiconductor active layer through the ohmic contact layer, and the ohmic contact layers are formed between the semiconductor active layer and the source electrode and also between the semiconductor active layer and the drain electrode. By this, the rise of $I_{OFF}$ can be prevented.

In addition, the space between the source electrode and the drain electrode is wider than the space between the ohmic contact layers, so that when the multi-layer film consisting of the conductor layers and the ohmic contact layers is etched, the formation of a gap in the ohmic contact layers beneath the end portions of the conductor layers can be avoided.

In a preferred embodiment as claimed in claim 2, the semiconductor active layer is formed of amorphous silicon, so that this layer can be formed at low temperatures of not higher than 350° C. This is beneficial for application to large-sized glass substrates.

In another preferred embodiment of the invention as claimed in claim 3, the ohmic contact layer is made of a semiconductor layer to which an impurity is added, and can be formed on a large-sized glass substrate, like amorphous silicon.

In further preferred embodiments of the invention, the conductor layer consists of a metal such as Al, Ti, Mo or Cu, or an alloy or compound thereof. If the space between the source and drain electrodes is wider than that of the ohmic contact layers, the ohmic contact layer and the conductor layers forming the source and drain electrodes can be continuously removed by the same etchant.

In another embodiment of the invention, since it is not necessary to form any channel protective layer, the number of steps can be reduced. Where the space between the source electrode and the drain electrode is formed as being wider than the space between the ohmic contact layers, they can be formed by continuously removing with the same etchant, making it unnecessary to use a plurality of masks and a plurality of etchants therefor. As a consequence, the number of steps can be reduced, enabling one to reduce the production costs.

In a further preferred embodiment, the etching rate of the etchant for the conductor layer of which the source and drain electrodes have been formed is higher than that for the ohmic contact layer. Accordingly, the space between the source electrode and the drain electrode kept away from each other can be formed as being wider than the space of the ohmic contact layers spaced from each other.

BRIEF DESCRIPTION OF THE DRAWINGS

FIG. 1 is a schematic sectional view of a thin film transistor (TFT) according to the invention;

FIG. 2 is a partially enlarged view of FIG. 1;

DETAILED DESCRIPTION OF THE INVENTION

Figure 3:
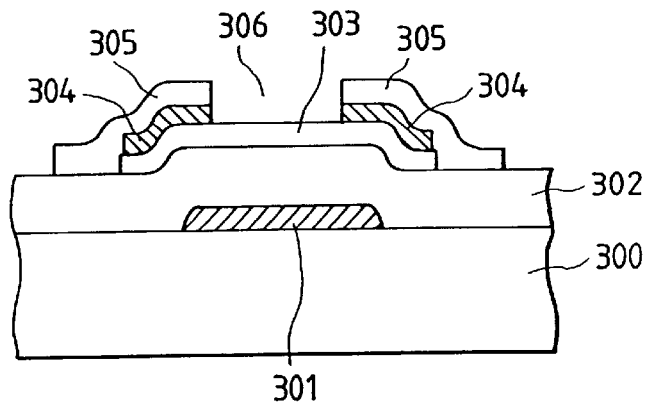
FIG. 3 is a schematic sectional view of one type of known thin film transistor (TFT)

The invention is described in more detail by way of examples, which should not be construed as limiting the invention thereto.

EXAMPLE 1

In this example, a relative positional relationship between a semiconductor active layer formed through a gate insulating film and a gate electrode was investigated. The width, Lg, of the gate electrode was set at 7 μm and the width, Ls, of the semiconductor active layer was changed. The relative amount of variation between the gate electrode and the semiconductor active layer each at one end thereof was changed from −1 μm to +1 μm.

FIG. 1 is a schematic view showing a sectional structure of a reverse staggered thin film transistor (TFT) which is an electronic device of the invention. In this example, the method for making an electronic device according to the invention was used to make a 100×100 TFT array.

First, a 100 mm square glass substrate (Corning 7059) 100 was precisely washed, on which a Cr film was formed in a thickness of 100 nm by a sputtering method (SP), followed by patterning with use of an etchant (cerium (IV) ammonium nitrate: 71% $HNO_3$:$H_2O$=500 g: 1900 cc: 1870 cc) to form a gate electrode 101 with an rode width of 7 μm.

Then, according to a plasma CVD method (CVD), a $SiN_x$ film (having a film thickness of 300 nm) and an i-type a-Si film (having a film thickness of 100 nm) were, respectively, deposited as a gate electrode 102 and a semiconductor active layer 103 in this order. The film-forming conditions of the respective layers are shown in Table 1.

TABLE 1

| Substrate | material: glass (Corning 7059) size: 100 mm square |
|---|---|
| Gate electrode | Width (Lg): 7 μm, thickness = 0.1 μm, material = Cr, method = SP, target = Cr, gas = Ar, gas pressure = 1 Pa., temperature = 100° C. |
| Gate insulating film | thickness = 0.3 μm, material: SiNx, method = CVD, gases = $SiH_4$, $NH_3$, $N_2$, $H_2$, gas pressure = 70 to 100 Pa., temperature = 250° C. |
| Semiconductor active layer | width (Ls) = 5 to 9 μm, thickness = 0.1 μm, material = i-type a-Si, method = CVD, gases = $SiH_4$, $H_2$, gas pressure = 70 to 100 Pa., temperature = 250° C. |
| Ohmic contact layer | space of layers (Do): 2.8 μm, thickness = 0.02 μm, material = $n^+$-type a-Si, method: SP, target = Si (doped with P), gas = Ar, gas pressure = 1 Pa., temperature = 150° C. |
| Conductor layer (source-drain electrode) | space of electrodes (Dc): 3 μm, thickness = 0.2 μm, material = Al—Si, method: SP, target = Al (doped with Si), gas = Ar, gas pressure = 1 Pa., temperature = 150° C. |

Subsequently, the semiconductor active layer 103 was divided into individual TFT devices by use of an etchant (HF: 0.54 mols/liter, $HIO_3$ 0.04 mols/liter)

After formation of contact holes through which gates were interconnected, an n+-type Si film (thickness: 20 nm) was deposited by a sputtering method for use as an ohmic contact layer 104, followed by forming an Al—Si film (doped with Si) in a thickness of 200 nm according to a sputtering method.

In order to form source-drain electrodes, interconnections and channel portions 106 (having a channel length of 3 μm and a channel width of 6 μm), the substrate was immersed in an etchant (25° C.) containing 0.1 mol/liter of HF and 0.04 mols/liter of HIO$_3$ for 2 minutes. By this, the conductor layer 105 consisting of the Al—Si film and the ohmic contact layer 104 consisting of the n+-type a-Si film were etched as desired.

FIG. 2 is a schematic view showing a channel portion after etching as observed through SEM. From FIG. 2, it will be seen that any gap between the conductor layer 105 and the ohmic contact layer 104 is not observed, thereby providing a smooth opening.

Finally, SiN$_x$ for passivation was deposited in a thickness of 400 nm according to a plasma CVD method, followed by making window openings for the gate interconnections and the source-drain interconnections, thereby completing the TFT's.

In Table 2, the results of measurements of ON current ($I_{ON}$) and OFF current ($I_{OFF}$) are summarized wherein $10^4$ TFT's are subjected to light irradiation from the back side thereof by use of a light source of 5000 cd/m$^2$.

TABLE 2

| Tests | Relative Amounts of Variation at One End Portions of Gate Electrode and Semiconductor Active Layer (μm) | | | |
|---|---|---|---|---|
| | −1 | −0.5 | 0 | +1 |
| $I_{ON}$: initial value (A) | 2 × 10$^{-6}$ | 2 × 10$^{-6}$ | 2 × 10$^{-6}$ | 2 × 10$^{-6}$ |
| $I_{OFF}$: initial value (A) | 1 × 10$^{-13}$ | 3 × 10$^{-12}$ | 2 × 10$^{-11}$ | 2 × 10$^{-11}$ |

As will be apparent from the results of Table 2, when the relative amount of variation at one end portions of the gate electrode and the semiconductor active layer takes a negative value, or when the width of the semiconductor layer is made smaller than the width of the gate electrode, the OFF current can be lowered. More particularly, in order to lower the OFF current, it is considered essential to (1) provide the semiconductor active layer just above the gate electrode through the gate insulating layer, and (2) make the width of the semiconductor active layer smaller than the width of the gate electrode.

The TFT structure illustrated in this example was so arranged that the semiconductor active layer was behind the width of the gate electrode, so that when it was irradiated with back light through the glass substrate, no carrier generated in the semiconductor active layer, thereby not permitting the OFF current to increase.

According to the method of this example, the following effects could be obtained.

(1) The semiconductor active layers and the conductor layers are not directly connected to each other but should be connected through the ohmic contact layer. Accordingly, when the gate electrode is rendered negative, the hole current is blocked. Thus, the resultant TFT gas has a small OFF current.

Figure 4:
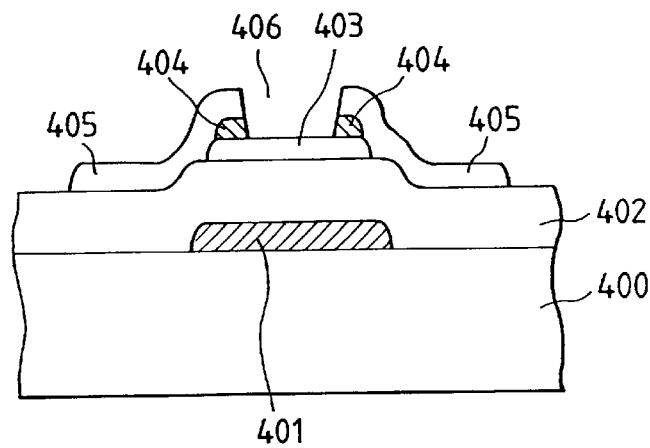
FIG. 4 is a schematic sectional view of another type of known thin film transistor (TFT)
Figure 5:
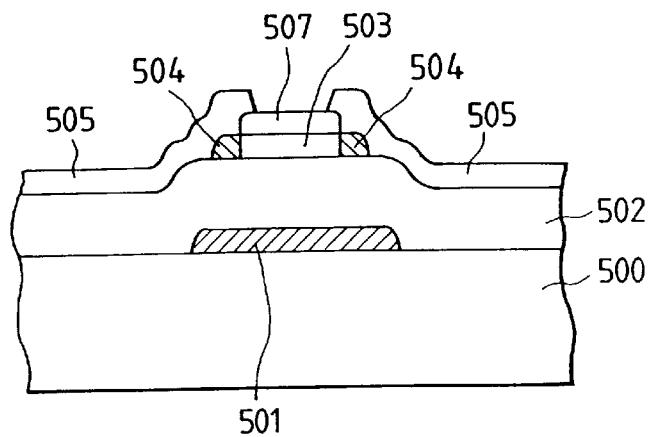
FIG. 5 is a schematic sectional view of a further type of known thin film transistor (TFT).

For comparison, a device was fabricated wherein a semiconductor active layer and a conductor layer were directly contacted as shown in FIG. 4 in such a way that the relative amount of variation at one end portions of the gate electrode and the semiconductor layer was −1 μm. The, the OFF current was measured and found to be 2×10$^{-11}$ A.

(2) Since the gate insulating film (SiN$_x$) and the semiconductor active layer (i-type a-Si) are continuously formed (the term "continuously" means that any exposure to air was not involved between individual steps) according to a CVD method, or the ohmic contact layer (n+-type a-Si) and the conductor layer (Al—Si) are continuously formed by an SP method, so that any oxide layer is not formed at the interface. Accordingly, the resultant device has a small parasite resistance.

(3) The conductor layer is made of a metal or alloy capable of being etched with HF—HIO$_3$, e.g. an Al—Si alloy film. Thus, the conductor layer and the ohmic contact layer (n+-type a-Si) may be continuously etched (i.e. etched through one resist mask by use of two types of etchants), or may be etched at one time (i.e. etched through one resist mask by use of one etchant). Accordingly, in a current path of one of the conductor layers (source electrode)–semiconductor active layer (channel)–the other of the conductor layers (drain electrode), the parasite resistance connected in series is derived only from that corresponding to the thickness of the ohmic contact layer (e.g. 10 to 50 nm). Thus, it is possible to make a TFT having a very smaller parasite resistance. In addition, the number of steps can be reduced, thus realizing low production costs.

(4) When the ohmic contact layer is formed, it is not necessary to use an ion implantation method. The layer is substantially free of any irregularity in thickness as would be otherwise ascribed to the impurity distribution inherent to the ion implantation. Eventually, a low resistance ohmic contact layer could be formed. In the ion implantation method, ions pass through the semiconductor active layer thereby damaging the gate insulating film therewith. In this connection, however, according to the SP method used in the present invention, such a disadvantage could be appropriately avoided. Additionally, it is not necessary to form any protective mask for the semiconductor active layer (channel) which is necessary for the ion implantation, so that the making process can be reduced in number, thus attaining low production costs.

EXAMPLE 2

In this example, the three cases of the relation between the space between the conductor layers, Dc, and the space between the ohmic contact layers, Do, (i.e. Dc>Do, Dc=Do and Dc<Do) were checked. To make such devices adapted for use in the three cases, the type of etchant B was properly changed.

In order to realize the relation of Dc=Do, an etchant used contained 0.1 mol/liter of HF and 0.01 mol/liter of HIO$_3$. For the case of Dc<Do, the conductor layer was first etched, at 35° C., with an etchant comprising 85% phosphoric acid, glacial acetic acid, water and 70% nitric acid at ratios by volume of 16:2:1:1, followed by etching the ohmic contact layer with another etchant comprising HF, nitric acid and acetic acid at ratios of 1:60:120.

Then, the general procedure of Example was repeated.

The results of measurements of carrier mobility, threshold value, ON current and OFF current of the results $10^4$ TFT's are summarized in Table 3. Further, a reliability test was conducted to compare characteristics prior to and after the test. The reliability test was effected such that each TFT substrate was placed in an environmental test vessel at a temperature of 85° C. and a relative humidity of 85% and allowed to stand over 1000 hours.

TABLE 3

| Test upper value: prior to reliability test lower value: after reliability test | Relationship of Dc and Do | | |
|---|---|---|---|
| | Dc > Do | Dc = Do | Dc < Do |
| Mobility ($cm^2$/v sec.) | 0.85 ± 0.05<br>0.85 ± 0.1 | 0.8 ± 0.1<br>0.78 ± 0.15 | 0.7 ± 0.15<br>0.4 ± 0.2 |
| Threshold value (V) | 1.0<br>1.0 | 1.2<br>1.6 | 1.5<br>2.5 |
| ON current (A) | $2 \times 10^{-6}$<br>$2 \times 10^{-6}$ | $2 \times 10^{-6}$<br>$2 \times 10^{-6}$ | $2 \times 10^{-6}$<br>$1.2 \times 10^{-6}$ |
| OFF current (A) | $1 \times 10^{-14}$<br>$1 \times 10^{-14}$ | $1 \times 10^{-13}$<br>$5 \times 10^{-12}$ | $1 \times 10^{-12}$<br>$1 \times 10^{-9}$ |

As will be apparent from the results of this example, when the space between the conductor layers, Dc, is greater than the space between the ohmic contact layers, Do, the OFF current can be lowered along with the ON current and mobility becoming high. The reason why the characteristics after the reliability test are good is considered as follows: any gap is not produced between the conductor layers and the ohmic contact layers, so that degradation based on pollutants which are liable to be left in the gap does not take place.

As will be apparent from the foregoing, the electronic device of the invention is small in OFF current ($I_{OFF}$). The semiconductor active layer can be formed on a large-sized glass substrate along with the ohmic contact layer. Moreover, where the space between the source electrode and the drain electrode is wider than the space between the ohmic contact layer, the ohmic contact layers, and the source and drain layers consisting of the conductor layer can be continuously etched with one etchant. The number of fabrication steps can be reduced, thereby leading to lower production costs.

What is claimed is:

1. A method of forming an electronic device, the method comprising:

(a) forming a gate electrode on one surface of a substrate, the gate electrode having a width;

(b) covering the substrate and the gate electrode with a gate insulating film;

(c) forming a semiconductor active layer on a portion of the gate insulating layer above the gate electrode, the semiconductor active layer having the width smaller than the width of the gate electrode;

(d) depositing a first ohmic contact layer of $n^+$-type Si on a first portion of a surface of the semiconductor active layer and a first portion of a surface of the gate insulating film by sputtering;

(e) depositing a source electrode comprising an Al—Si film as a first conductor layer on the first ohmic contact layer by sputtering;

(f) depositing a second ohmic contact layer made of $n^+$-type Si on a second portion of a surface of the semiconductor active layer and a second portion of a surface of the gate insulating film by sputtering;

(g) depositing a drain electrode comprising an Al—Si film as a second conductor layer on the second ohmic contact layer by sputtering; and (h) simultaneously processing the source electrode, the drain electrode, and the first and second ohmic contact layers by immersing them in an etchant;

wherein the etchant etches the source electrode and the drain electrode at a first etching rate and the etchant etches the first and second ohmic contact layers at a second etching rate and the first etching rate is higher than the second etching rate;

wherein the first and second ohmic contact layers are opposed to each other with a space therebetween; and wherein the first ohmic contact layer is formed to extend from the first portion of the surface of the semiconductor active layer to the first portion of the surface of the gate insulating film so as to interrupt contact between the source electrode and both the semiconductor active layer and the gate insulating film, and the second ohmic contact layer is formed to extend from the second portion of the surface of the semiconductor active layer to the second portion of the surface of the gate insulating film so as to interrupt contact between the drain electrode and both the semiconductor active layer and the gate insulating film.

2. The method of claim 1, wherein the semiconductor active layer is made of amorphous silicon.

3. The method of claim 1, wherein the gate electrode is made of Cr.

* * * * *

UNITED STATES PATENT AND TRADEMARK OFFICE
CERTIFICATE OF CORRECTION

PATENT NO.      : 6,518,108 B2
DATED           : February 11, 2003
INVENTOR(S)     : Hirofumi Fukui et al.

It is certified that error appears in the above-identified patent and that said Letters Patent is hereby corrected as shown below:

Column 7,
Line 44, delete "having the width" and substitute -- having a width -- in its place.

Signed and Sealed this

Fifteenth Day of April, 2003

JAMES E. ROGAN
*Director of the United States Patent and Trademark Office*